(12) United States Patent
Odate et al.

(10) Patent No.: US 7,680,282 B2
(45) Date of Patent: Mar. 16, 2010

(54) SIGNAL PROCESSING CIRCUIT

(75) Inventors: Naoki Odate, Kawasaki (JP); Katsuhiro Yoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1429 days.

(21) Appl. No.: 10/943,926

(22) Filed: Sep. 20, 2004

(65) Prior Publication Data

US 2005/0265556 A1    Dec. 1, 2005

(30) Foreign Application Priority Data

May 27, 2004    (JP) ............................. 2004-158147

(51) Int. Cl.
*H04L 9/00* (2006.01)

(52) U.S. Cl. ........................ 380/287; 380/268; 327/365; 455/131

(58) Field of Classification Search ................. 380/287, 380/268; 327/365; 455/131
See application file for complete search history.

(56) References Cited

U.S. PATENT DOCUMENTS

| | | | | |
|---|---|---|---|---|
| 5,101,369 A * | 3/1992 | Torii et al. | ................... | 708/314 |
| 5,148,384 A * | 9/1992 | Ikegaya et al. | .............. | 708/420 |
| 5,333,199 A * | 7/1994 | Kuwasaki | ....................... | 381/1 |
| 5,572,453 A * | 11/1996 | Miyake et al. | .............. | 708/521 |
| 5,612,974 A * | 3/1997 | Astrachan | .................. | 375/295 |
| 5,621,800 A * | 4/1997 | Weng et al. | ................. | 380/266 |
| 5,652,903 A * | 7/1997 | Weng et al. | .................... | 712/35 |
| 5,659,698 A * | 8/1997 | Weng et al. | ................. | 711/220 |
| 5,717,943 A * | 2/1998 | Barker et al. | .................. | 712/20 |
| 5,768,613 A * | 6/1998 | Asghar | ........................ | 712/35 |
| 5,784,602 A * | 7/1998 | Glass et al. | ................. | 712/220 |
| 5,815,540 A * | 9/1998 | Aoki | .......................... | 375/376 |
| 5,835,529 A * | 11/1998 | Koga et al. | ................... | 375/131 |
| 5,943,242 A * | 8/1999 | Vorbach et al. | ................ | 716/17 |
| 6,021,421 A * | 2/2000 | Retter et al. | ................. | 708/422 |
| 6,028,886 A * | 2/2000 | Koga et al. | ................... | 375/133 |
| 6,185,256 B1 * | 2/2001 | Saito et al. | ................... | 375/257 |
| 6,327,316 B1 * | 12/2001 | Ikeda | ......................... | 375/341 |

(Continued)

FOREIGN PATENT DOCUMENTS

JP    63067628 A    3/1988

(Continued)

OTHER PUBLICATIONS

Japanese Office Action mailed Aug. 18, 2009 for Japanese Patent Application No. 2004-158147. (Partial English-language translation is provided.).

*Primary Examiner*—David García Cervetti
(74) *Attorney, Agent, or Firm*—Fujitsu Patent Center

(57) ABSTRACT

A signal processing circuit is configured by connecting a plurality of basic circuits connected in series, each of the basic circuits comprising an arithmetic circuit subjecting a first input signal and a second input signal to a signal processing; a first selection circuit outputting the first input signal or an output signal of the arithmetic circuit; and a second selection circuit outputting the second input signal or an output signal of the arithmetic circuit, so as to make it possible to change operations of the circuit as a whole by properly making a selection on which signal should be output with the aid of the first and second selection circuits, and to execute different signal processing on a single circuit depending on the selection.

15 Claims, 11 Drawing Sheets

U.S. PATENT DOCUMENTS

| | | | |
|---|---|---|---|
| 6,400,614 B1* | 6/2002 | Hiromori et al. | 365/189.14 |
| 6,404,930 B2* | 6/2002 | Inuzuka et al. | 382/235 |
| 6,414,983 B1* | 7/2002 | Koga et al. | 375/132 |
| 6,415,005 B2* | 7/2002 | Koga et al. | 375/347 |
| 6,515,519 B1* | 2/2003 | Miyazaki et al. | 327/105 |
| 6,625,740 B1* | 9/2003 | Datar et al. | 713/324 |
| 6,757,334 B1* | 6/2004 | Feher | 375/259 |
| 6,879,188 B2* | 4/2005 | Miyazaki et al. | 327/105 |
| 6,977,910 B1* | 12/2005 | Hosur et al. | 370/318 |
| 7,007,002 B2* | 2/2006 | Matsugu et al. | 706/22 |
| 7,039,614 B1* | 5/2006 | Candelore | 705/57 |
| 7,107,387 B2* | 9/2006 | Mosch | 711/102 |
| 7,114,055 B1* | 9/2006 | Baxter | 712/37 |
| 7,274,790 B2* | 9/2007 | Ryan et al. | 380/210 |
| 7,287,210 B2* | 10/2007 | MacDougall | 714/786 |
| 7,340,497 B2* | 3/2008 | Kikuchi et al. | 708/402 |
| 7,394,052 B2 | 7/2008 | Fujii et al. | |
| 2001/0008518 A1* | 7/2001 | Atsuta | 370/220 |
| 2001/0009379 A1* | 7/2001 | Shiflet | 326/44 |
| 2001/0009386 A1* | 7/2001 | Nakamura | 327/278 |
| 2001/0009483 A1* | 7/2001 | Satoh et al. | 360/65 |
| 2001/0014131 A1* | 8/2001 | Mashimo et al. | 375/289 |
| 2003/0004583 A1* | 1/2003 | Matsugu et al. | 700/4 |
| 2003/0074627 A1* | 4/2003 | MacDougall | 714/786 |
| 2003/0098730 A1* | 5/2003 | Miyazaki et al. | 327/158 |
| 2003/0133621 A1 | 7/2003 | Fujii et al. | |
| 2003/0156480 A1* | 8/2003 | Mosch | 365/200 |
| 2004/0128474 A1* | 7/2004 | Vorbach | 712/10 |
| 2005/0021871 A1* | 1/2005 | Georgiou et al. | 709/250 |
| 2005/0198458 A1* | 9/2005 | Cho | 711/163 |

FOREIGN PATENT DOCUMENTS

| | | |
|---|---|---|
| JP | 63204919 A | 8/1988 |
| JP | 03052432 A | 3/1991 |
| JP | 04292018 A | 10/1992 |
| JP | 2003-115048 A | 4/2003 |

* cited by examiner

F I G. 6
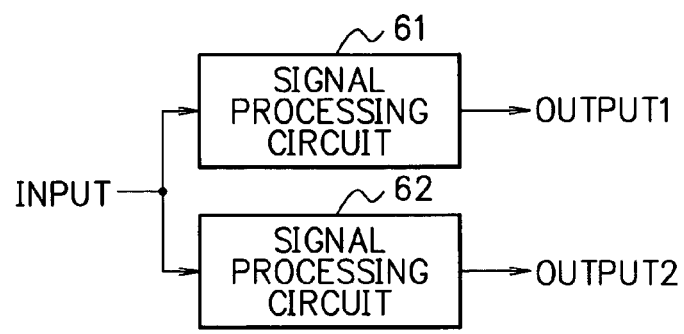
F I G. 7
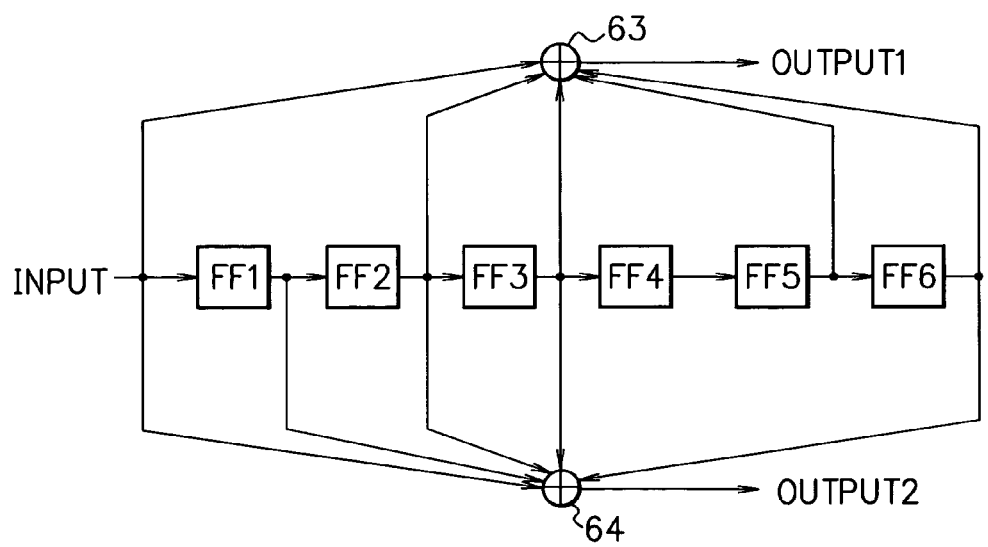

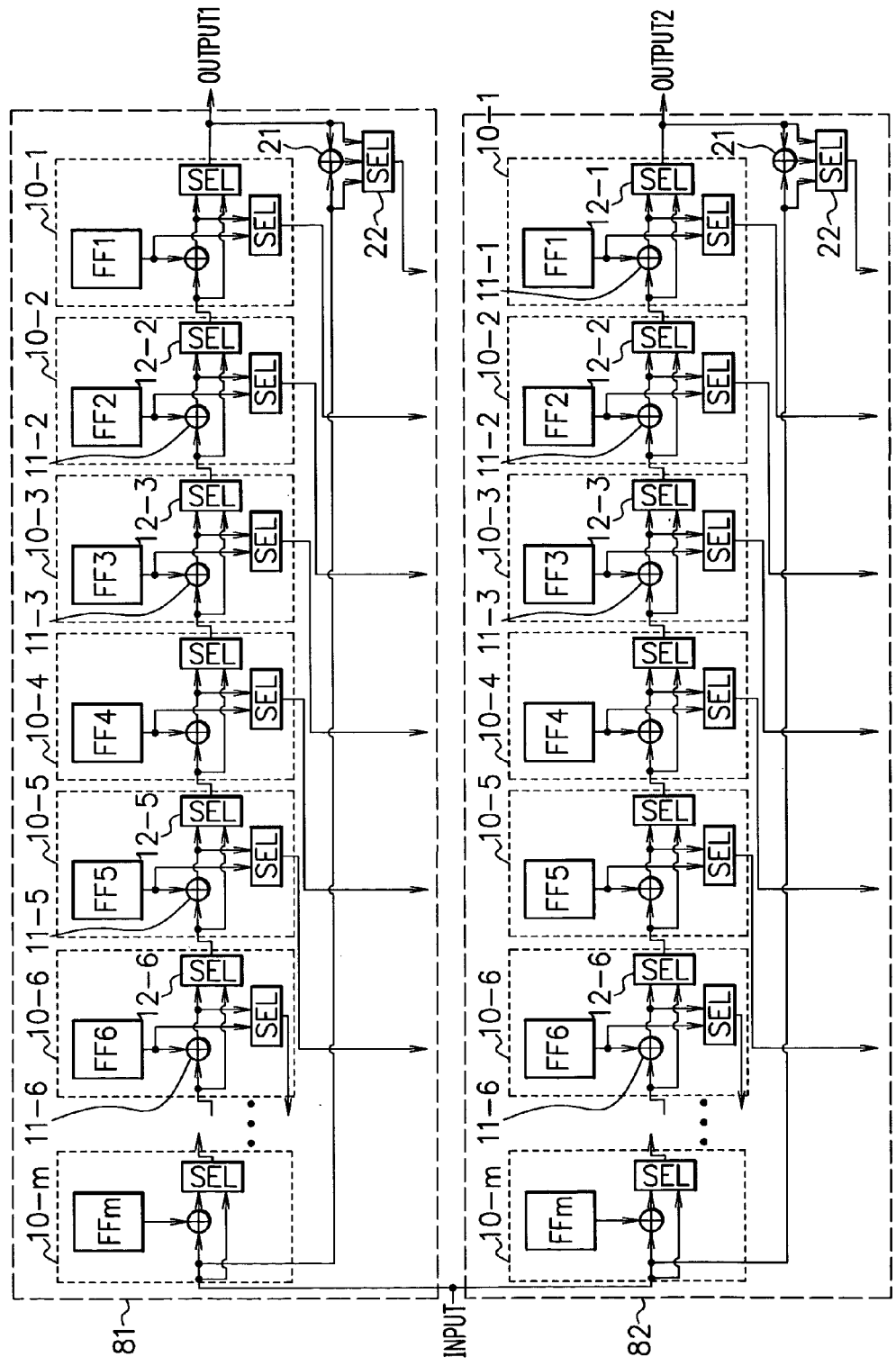
F I G. 8

F I G. 9
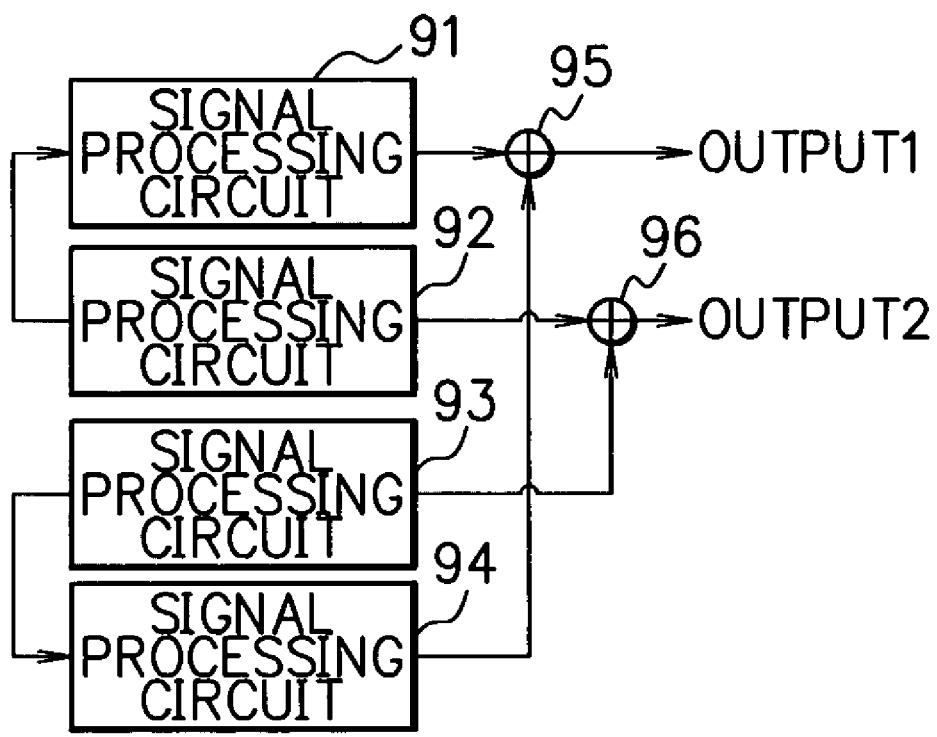

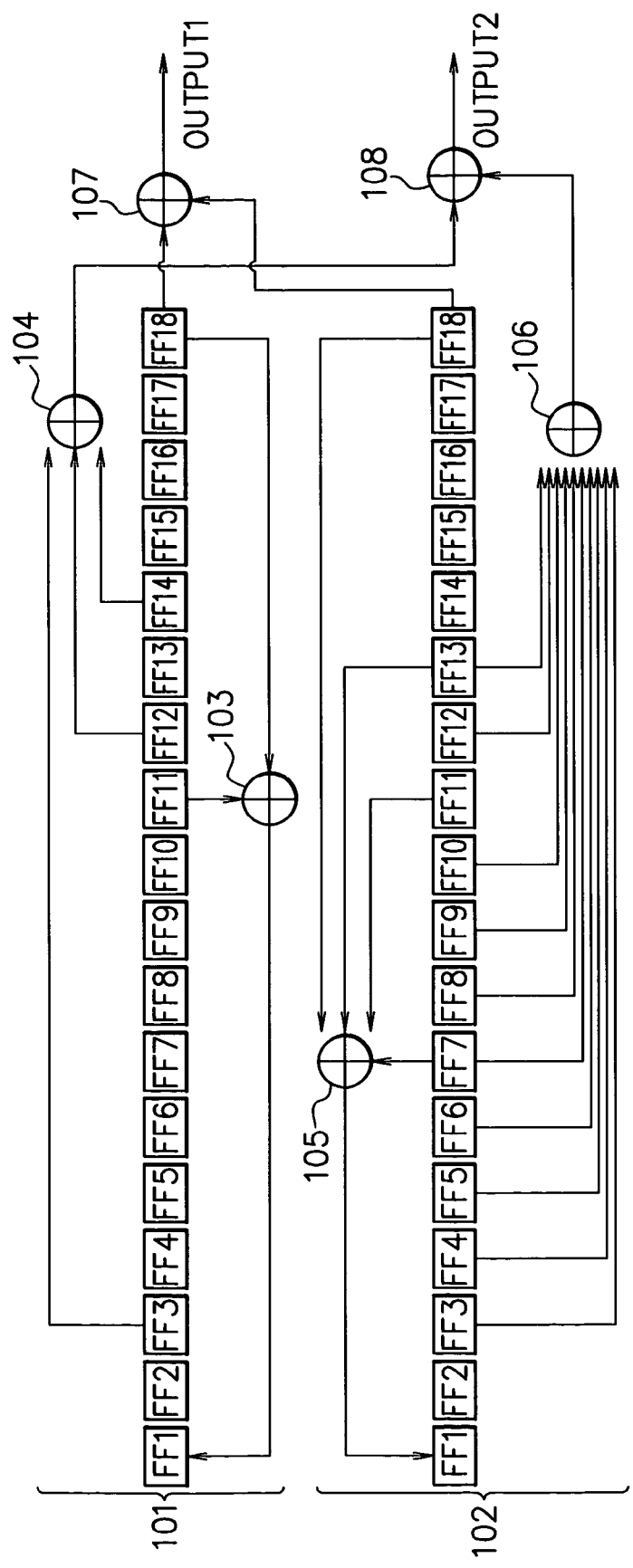
F I G. 10

F I G. 12
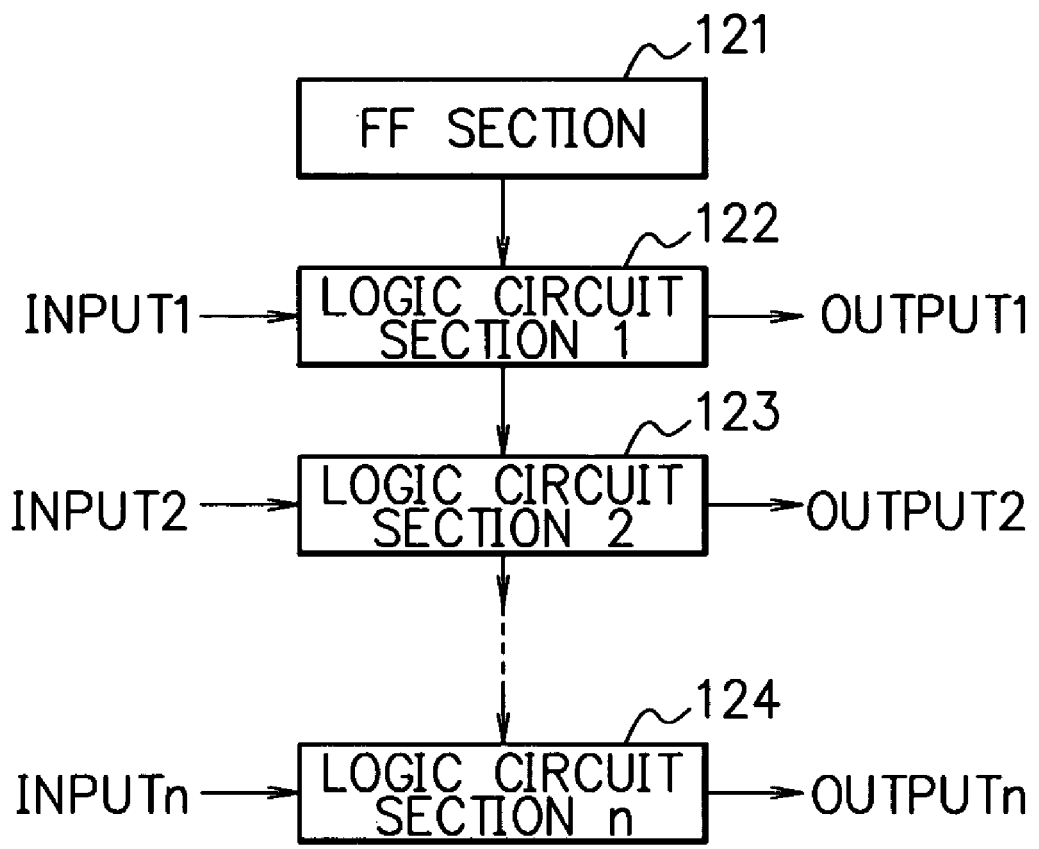

SIGNAL PROCESSING CIRCUIT

CROSS-REFERENCE TO RELATED APPLICATIONS

This application is based upon and claims the benefit of priority from the prior Japanese Patent Application No. 2004-158147, filed on May 27, 2004, the entire contents of which are incorporated herein by reference.

BACKGROUND OF THE INVENTION

1. Field of the Invention

The present invention relates to a signal processing circuit, and in particular to a signal processing circuit capable of performing two or more types of circuit operations.

2. Description of the Related Art

Data processing conventionally required by many of communication standards such W-CDMA as a mobile communication standard, and IEEE802.11a or IEEE802.11b as a wireless LAN standard has been carried out by using scrambler, convolutional encoder, cyclic redundancy check (CRC) circuit, quasi-random encoder based on linear feedback shift register and so forth. There are also adopted a Viterbi decoder, a matched filter, and fast Fourier transformation (FFT) composed of a butterfly routine executing complex multiplication and complex summation.

Patent Documents 1 and 2 listed below respectively describe a quasi random number generating circuit using a linear feedback shift register. Patent Document 3 listed below describes a variable CRC generation circuit. Patent Document 4 listed below describes a scrambler.

[Patent Document 1] Japanese Patent Application Laid-Open No. Sho 63-67628
[Patent Document 2] Japanese Patent Application Laid-Open No. Sho 63-204919
[Patent Document 3] Japanese Patent Application Laid-Open No. Hei 4-292018
[Patent Document 4] Japanese Patent Application Laid-Open No. Hei 3-52432

The conventional scrambler and CRC generator are configured as separate fixed circuits because of their differences in the processing. It has also been necessary for the conventional scrambler and CRC generator to modify position or the number of taps depending on every different communication standard. As a consequence, the scramblers, for example, even having the same function should have been configured by hardware dedicated for the individual communication standards, and by the separate fixed circuits.

SUMMARY OF THE INVENTION

An object of the present invention is to realize different functions on a single circuit. Another object of the present invention is to make it possible to configure two or more types of circuits using a single circuit having an identical function.

A signal processing circuit of the present invention comprises a plurality of basic circuits connected in series, each of the basic circuits comprising an arithmetic circuit subjecting a first input signal and a second input signal to a signal processing; a first selection circuit outputting the first input signal or an output signal of the arithmetic circuit; and a second selection circuit outputting the second input signal or an output signal of the arithmetic circuit.

The above-described configuration makes it possible to change circuit operations by properly making a selection on which signal should be output with the aid of the first and second selection circuits, and to execute different signal processing on a single circuit depending on the selection.

BRIEF DESCRIPTION OF THE DRAWINGS

FIG. 6 is a drawing explaining a principle of configuration of a convolutional encoder using the signal processing circuit of the present embodiment;

FIG. 7 is a drawing showing an exemplary configuration of the convolutional encoder;

FIG. 8 is a circuit diagram showing a configuration of the convolutional encoder using the signal processing circuit of the present embodiment;

FIG. 9 is a drawing explaining a principle of configuration of a linear feedback shift register using the signal processing circuit of the present embodiment;

FIG. 10 is a drawing showing an exemplary configuration of a linear feedback register;

FIG. 12 is a drawing explaining a principle of configuration of an n-bit batch processing circuit using the signal processing circuit of the present embodiment;

DETAILED DESCRIPTION OF THE PREFERRED EMBODIMENTS

The following paragraphs will describe embodiments of the present invention referring to the attached drawings.

Figure 1A:
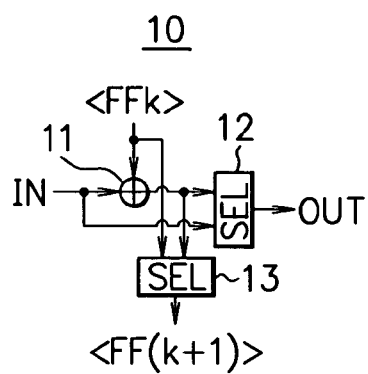
FIGS. 1A and 1B are drawings showing an exemplary configuration of the basic circuit composing the signal processing circuit of an embodiment of the present invention.

FIG. 1A is a circuit diagram showing an exemplary configuration of a basic circuit 10 composing the signal processing circuit of the present embodiment.

The basic circuit 10 comprises an exclusive OR circuit (referred to as "EOR circuit", hereinafter) 11, and two selection circuits (referred to as "selector", hereinafter) 12, 13. The selectors 12, 13 are 2-1 selectors selectively output one of two inputs.

The EOR circuit 11 receives an input signal IN as the first input, and an output of a flipflop FFk (k is a suffix, and denotes a natural number) (not shown) as the second input. The EOR circuit 11 performs EOR operation of these input signals, and outputs a result of the operation.

The selector 12 receives the output from the EOR circuit 11 and the input signal IN. The selector 12 selects the output from the EOR circuit 11 or the input signal IN in an alternative way, and outputs the selected one as an output signal OUT. Similarly, the selector 13 receives the output from the EOR circuit 11 and an output signal from the flip-flop FFk. The selector 13 selects the output from the EOR circuit 11 or the output signal of the flipflop FFk in an alternative way, and outputs the selected one as an update value for a flipflop FF(k+1). The selectors 12 and 13 are controlled independently from each other typically by an unillustrated selection signal.

Figure 1B:
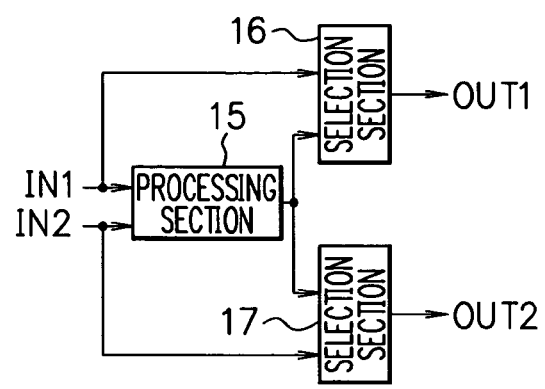

FIG. 1B is a drawing showing a functional configuration of the basic circuit 10 shown in FIG. 1A.

In FIG. 1B, reference numeral 15 denotes a processing section which corresponds to the EOR circuit 11 shown in FIG. 1A. The processing section 15 subjects first and second inputs IN1, IN2, which are input thereto, to a predetermined signal processing, and outputs a result.

Reference numerals 16 and 17 are first and second selection sections which correspond to the selector 12 and 13, respectively, shown in FIG. 1A. The first selection section 16 selectively outputs either of the first input IN1 and the output from the processing section 15, which are input thereto, as an output OUT1, and the second selection section 17 selectively outputs either of the second input IN2 and the output from the processing section 15, which are input thereto, as an output OUT2.

In other words, the basic circuit 10 shown in FIG. 1A and FIG. 1B is configured so as to alternatively select either one of the signal after being subjected to a predetermined signal processing and the intact signal not being processed, with respect to each of two inputs.

The signal processing circuit of the present embodiment is configured by using two or more basic circuits 10 explained referring to FIG. 1A and FIG. 1B, and by connecting them in series.

Figure 2:
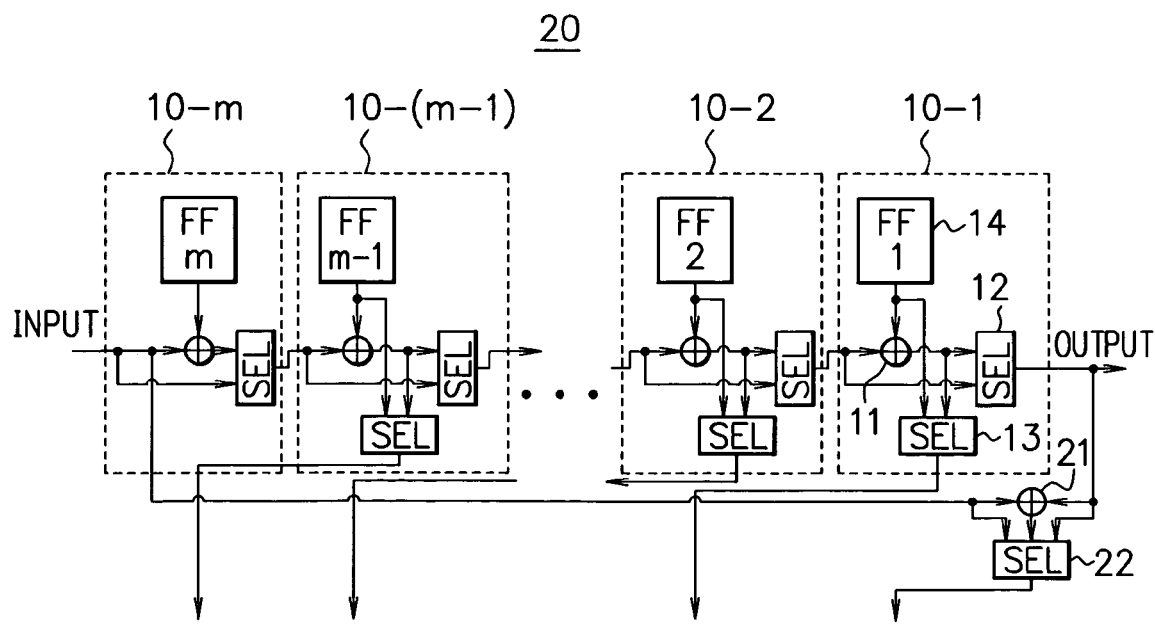
FIG. 2 is a circuit diagram of an exemplary configuration of the signal processing circuit of the present embodiment.

FIG. 2 is a circuit diagram showing an exemplary configuration of a signal processing circuit 20 of the present embodiment. It is to be noted that FIG. 2 illustrates the signal processing circuit 20 as one example comprises m (where, m is an arbitrary natural number) basic circuits.

In FIG. 2, reference numeral 10-i (where, i is a suffix, and a natural number from 1 to m) denotes the basic circuit. Each basic circuit 10-i comprises the EOR circuit 11, selectors 12 and 13, and a flip-flop (holding circuit) FFi (where, only the basic circuit 10-m has no selector 13). It is to be noted that the internal configuration of each basic circuit 10-i is similar to those shown in FIG. 1A and FIG. 1B except that the flipflop FFi is illustrated, and will therefore not be detailed herein.

An output of the selector 12 of the basic circuit 10-i is supplied to the basic circuit 10-($i-1$) as the input signal IN. An output of the selector 13 of the basic circuit 10-i is supplied as an update value for the flipflop FF(i+1) of the basic circuit 10-($i+1$). An external input signal INPUT to the signal processing circuit 20 is input as the input signal IN of the basic circuit 10-m, and an output of the selector 12 of the basic circuit 10-1 is output as an output signal OUTPUT of the signal processing circuit 20.

Reference numeral 21 denotes an EOR circuit, to which the external input signal INPUT to the signal processing circuit 20 (input signal IN to the basic circuit 10-m) and the output signal OUTPUT from the signal processing circuit 20 (output signal OUT from the selector 12 of the basic circuit 10-1) are input. The EOR circuit 21 performs EOR operation of these input signals, and outputs a result of the operation.

Reference numeral 22 denotes a selector (in more detail, a 3-1 selector which selectively outputs one of three inputs), to which the external input signal INPUT to the signal processing circuit 20, the output signal OUTPUT from the signal processing circuit 20, and an output from the EOR circuit 21. The selector 22, under control by an unillustrated selection signal for example, selects one signal out of the external input signal INPUT, the output signal OUTPUT and an output from the EOR circuit 21, and outputs the selected one as an update value for the flip-flop FF1.

As described in the above, the configuration in which two or more basic circuits 10 are connected in series, and a proper control of the selectors 12 and 13 of the individual basic circuits 10 make it possible for the signal processing circuit 20 to perform circuit operations differing in the functions thereof, and circuit operations identical in the functions thereof while differing in types. For example, use of the signal processing circuit 20 shown in FIG. 2 makes it possible to realize functions of scrambler, CRC generator, convolutional encoder, linear feedback shift register, n-bit batch processing circuit, and so forth.

The signal processing circuit 20 is configured by connecting the basic circuits 10-i in series in the direction inverse to the direction of the shift operation (FF1→FFm) using the flipflops FFi of the individual basic circuits 10-i as the shift registers. In other words, the signal processing circuit 20 is configured by inverting the order of the registers followed by the EOR circuit 11 as viewed from the input side of the signal processing circuit 20. This makes it no more necessary to use feedback signal, which has generally been sent from the flipflop FFm to flipflop FF1 in the conventional circuit, and realizes a circuit operation independent of the register length (number of stages). It is made possible, for example, to realize different types of circuit operations corresponding to an arbitrary number of stages not larger than the number of basic circuits, even under same functions such as those of scrambler, CRC generator and so forth.

The following paragraphs will specifically describe a scrambler, a CRC generator, a convolutional encoder, a linear feedback shift register and an n-bit batch processing circuit using the signal processing circuit of the present embodiment.

(Scrambler, CRC Generator)

First, a scrambler and a CRC generator using the signal processing circuit of the present embodiment will be explained referring to FIG. 3 to FIG. 5. It is to be noted that the scrambler and CRC generator herein are exemplified as having a register length of 5, where the present invention is by no means limited thereto allowing an arbitrary register length.

Figure 3:
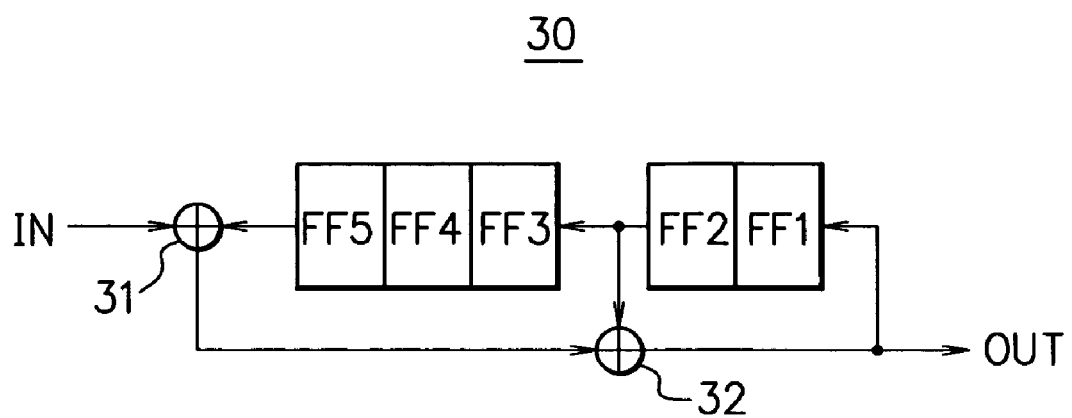
FIG. 3 is a drawing showing an exemplary configuration of a scrambler circuit.

FIG. 3 is a drawing showing an exemplary configuration of a scrambler circuit 30. Five flipflops FF1 to FF5 are connected in series, wherein an output of the flipflop FFn (n is a natural number from 1 to 4) is input to flipflop FF(n+1). EOR circuit 31 receives the input signal IN and an output signal of the flipflop FF5, performs EOR operation of these signals, and outputs a result of the operation. The EOR circuit 32 receives an output signal of the flipflop FF2 and an output of the EOR circuit 31, performs EOR operation of these signals, and outputs a result of the operation. The output of the EOR circuit 32 is input to the flipflop FF1, and is also output as an output signal OUT from the scrambler circuit 30.

Figure 5:
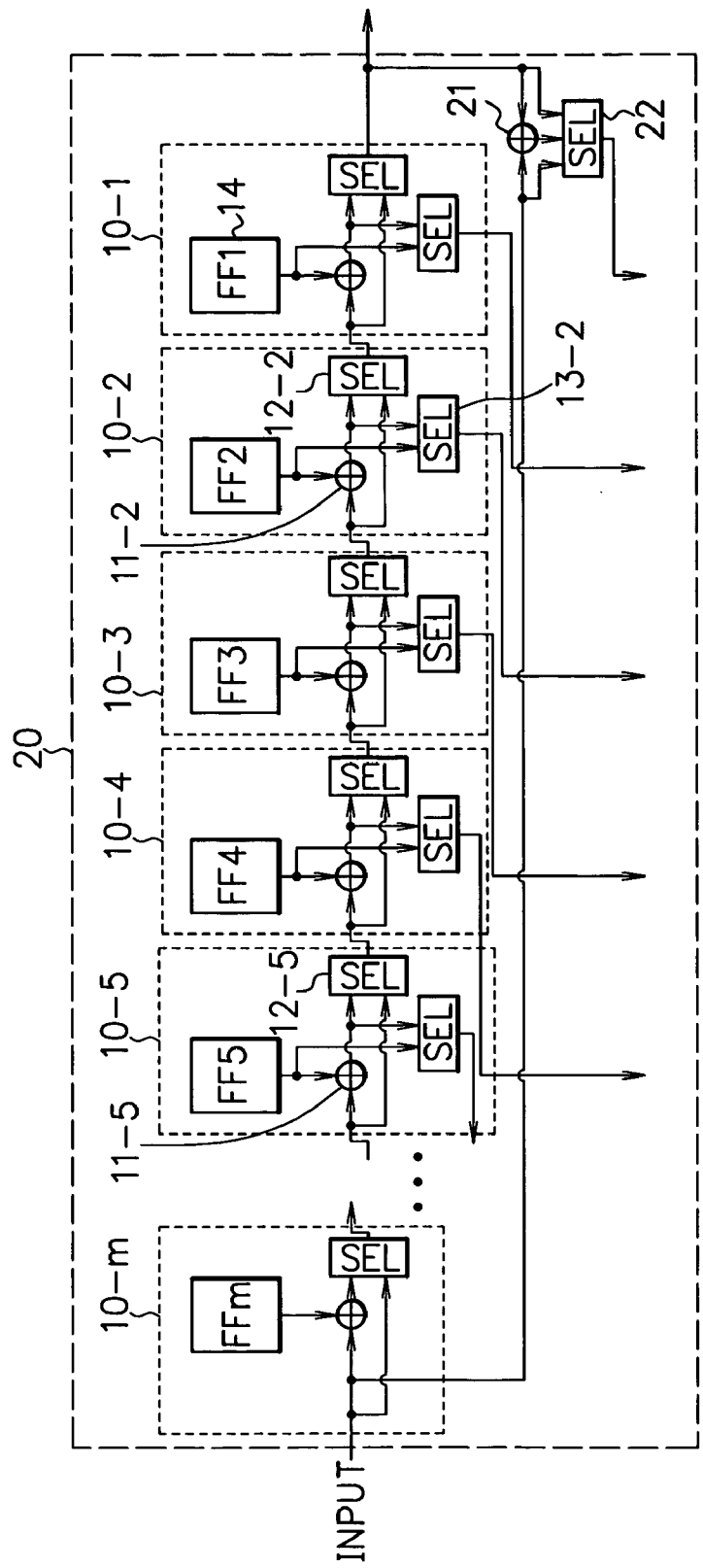
FIG. 5 is a drawing showing a method of realizing the scrambler circuit shown in FIG. 3 and the CRC generator shown in FIG. 4.

Next paragraphs will describe a case where the circuit operation of the scrambler circuit 30 shown in FIG. 3 is realized by the signal processing circuit 20 of the present embodiment, shown in FIG. 5. A configuration of the signal processing circuit 20 shown in FIG. 5 is same as that of signal processing circuit 20 previously shown in FIG. 2.

The circuit operation of the scrambler circuit 30 shown in FIG. 3 can be realized by controlling the selectors 12-2, 12-5 of the basic circuits 10-2, 10-5 so as to select and output the outputs from the EOR circuits 11-2, 11-5, and by controlling the selectors 12 of the other basic circuits 10 so as to select and output the input signal IN. The selectors 13 of the individual basic circuits 10 are controlled so as to select and output the output per se of the internal flipflops FF. The selector 22 is controlled so as to select and output the output signal OUTPUT of the signal processing circuit 20.

By controlling the selectors 12 in the individual basic circuits 10 as described in the above, the input signal INPUT entered to the signal processing circuit 20 is subjected to EOR operation together with the outputs from the flipflops FF2, FF5 in the EOR circuits 11-2, 11-5 of the basic circuits 10-2, 10-5, respectively, but is output from the other basic circuits 10 without any processing as the output signal OUTPUT of the signal processing circuit 20. By controlling the selectors 13, 22 as described in the above, an output from the flipflop FFi is supplied as an update value to the flipflop FF(i+1), and the output signal OUTPUT is supplied as an update value to the flipflop FF1. It is therefore made possible to realize the circuit operation of the scrambler circuit 30 shown in FIG. 3, by using the signal processing circuit 20 of the present embodiment and by properly controlling the selectors located to the tap positions of the individual flipflops FFi.

Figure 4:
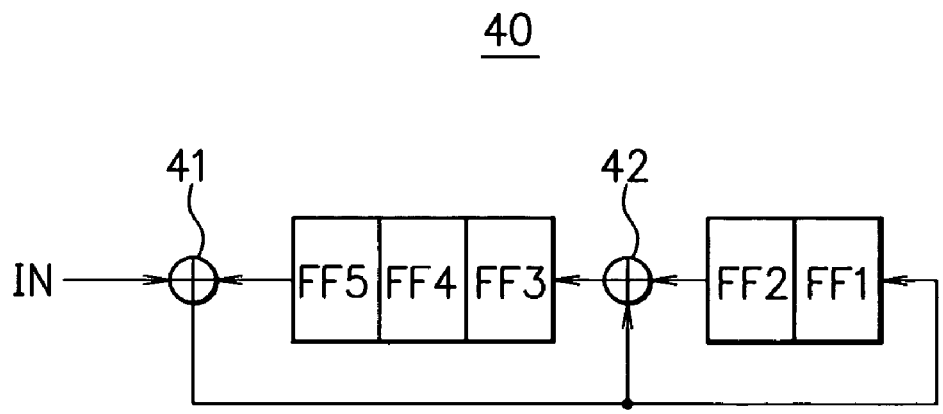
FIG. 4 is a drawing showing an exemplary configuration of a CRC generator.

FIG. 4 is a drawing showing an exemplary configuration of a CRC generator 40. Five flip-flops FF1 to FF5 are connected in series, and an output of the flipflop FFn (where, n is a natural number from 1 to 4) is input to the flipflop FF(n+1). An EOR circuit 41 receives the input signal IN and an output signal of the flipflop FF5, performs EOR operation of these signals, and outputs a result of the operation. The output of the EOR circuit 41 is input to the flipflop FF1, and also to an EOR circuit 42. The EOR circuit 42 receives an output signal of the flip-flop FF2 and the output of the EOR circuit 41, performs EOR operation of these signals, and outputs a result of the operation. The output of the EOR circuit 42 is input to the flipflop FF3.

For the purpose of realizing the circuit operation of the CRC generator 40 shown in FIG. 4 by using the signal processing circuit 20 shown in FIG. 5, the control is made so that the selector 12-5 of the basic circuit 10-5 selects and outputs an output of the EOR circuit 11-5, and so that the selectors 12 of the other basic circuits 10 select and output the input signal IN. Similarly, the control is made so that the selector 13-2 of the basic circuit 10-2 selects and outputs an output of the EOR circuit 11-2, and so that the selectors 13 of the other basic circuits 10 select and output the output per se of the internal flipflops FF. The selector 22 is controlled so as to select and output the output signal OUTPUT of the signal processing circuit 20.

By controlling the selectors 12, 13 in the individual basic circuits 10 as described in the above, the input signal INPUT entered to the signal processing circuit 20 is subjected to EOR operation together with the output from the flipflop FF5 in the EOR circuit 11-5 of the basic circuit 10-5. On the other hand, an output of the flipflop FF2 and an output from the EOR circuit 11-5 are subjected to EOR operation in the EOR circuit 11-2 of the basic circuit 10-2, and a result is input as an update value to the flipflop FF3. Outputs of the flip-flops FFi other than the flipflop FF3 are supplied as update values to the flipflops FF(i+1), and the output signal OUTPUT is supplied as an update value to the flipflop FF1. It is therefore made possible to realize the circuit operation of the CRC generator 40 shown in FIG. 4, by using the signal processing circuit 20 of the present embodiment and by properly controlling the selectors located to the tap positions of the individual flipflop FFi.

As described in the above, proper control of the selectors 12, 13 in the individual basic circuits 10 and the selector 22, owned by the signal processing circuit 20, makes it possible to realize the circuit operations of the scrambler 30 and CRC generator 40.

The signal processing circuit 20 has no feedback signal line from the flipflop FFm, which has generally been adopted in this sort of scrambler and CRC generator. This successfully adapts the circuit to an arbitrary register length by invalidating the processing of the basic circuits 10 by a predetermined number counted from the input side, in other words, by outputting the input signal intact without any processing, based on the number of stages required for the scrambler or CRC generator, provided that the number is not larger than the number of basic circuits (the number of the flipflops FF) composing the signal processing circuit 20. It is therefore made possible to realize circuit operations of the scrambler and CRC generator, which differ in types of operations, such as in the number of stages (register length).

(Convolutional Encoder)

Next paragraphs will describe a convolutional encoder using the signal processing circuit of the present embodiment referring to FIG. 6 to FIG. 8. It is to be noted that the following description deals with an exemplary convolutional encoder having an encoding ratio of ½.

FIG. 6 is a drawing explaining a principle of configuration of a convolutional encoder 60 using the signal processing circuit of the present embodiment. In FIG. 6, reference numerals 61, 62 denote signal processing circuits respectively configured similarly to the signal processing circuit 20. That is, the convolutional encoder 60 is configured by using two signal processing circuits 20 of the present embodiment.

The signal processing circuits 61, 62 receive an identical input signal INPUT, respectively perform predetermined operations on the input signal INPUT, and output results as output signals OUTPUT1, OUTPUT2. Initial values of the flipflops FFi in the basic circuits 10-i composing the signal processing circuits 61, 62 are synchronized. In other words, correspondent flipflops FFi marked with the same value of i in the signal processing circuits 61, 62 have the same value set as the initial value.

FIG. 7 is a drawing showing an exemplary configuration of the convolutional encoder. Six flipflops FF1 to FF6 are connected in series, wherein an output of a flipflop FFn (where, n is a natural number from 1 to 5) is input to a flipflop FF(n+1). The input signal INPUT is input to the flipflop FF1. The EOR circuit 63 performs EOR operation of the input signal INPUT and output signals of the flipflops FF2, FF3, FF5, FF6, and outputs a result as the output signal OUTPUT1. The EOR circuit 64 performs EOR operation of the input signal INPUT and output signals of the flipflops FF1, FF2, FF3, FF6, and outputs a result as the output signal OUTPUT2.

Next paragraphs will describe a case where the convolutional encoder shown in FIG. 7 is realized by the signal processing circuit 20 of the present embodiment, referring to FIG. 8.

FIG. 8 is a circuit diagram of a configuration of the convolutional encoder using the signal processing circuit of the present embodiment. In FIG. 8, reference numerals 81, 82 denote signal processing circuits which are similar to the signal processing circuit 20 shown in FIG. 2, allowing omission of explanation on the configuration. The signal processing circuits 81, 82 equally receive the input signal INPUT, and output the output signals OUTPUT1, OUTPUT2, respectively.

The circuit operation of the convolutional encoder shown in FIG. 7 can be realized by controlling the selectors 12-2, 12-3, 12-5, 12-6 of the basic circuits 10-2, 10-3, 10-5, 10-6 in the signal processing circuit 81 so as to select and output the outputs from the EOR circuits 11-2, 11-3, 11-5, 11-6, and by controlling the selectors 12 of the other basic circuits 10 so as to to select and output the input signal IN. On the other hand, the selectors 12-1 to 12-3 and 12-6 of the basic circuits 10-1 to 10-3 and 10-6 in the signal processing circuit 82 are controlled so as to select and output the outputs from the EOR circuits 11-1 to 11-3 and 11-6, and the selectors 12 of the other basic circuits 10 are controlled so as to select and output the input signal IN.

The selectors 13 of the individual basic circuits 10 in the signal processing circuits 81, 82 are controlled so as to select and output the outputs per se of the internal flipflops FF, and at the same time, the selectors 22 are controlled so as to select and output the input signal INPUT.

It is to be noted that, as described previously, the correspondent flipflops FFi in the signal processing circuits 81, 82 have the same initial value input thereto.

By controlling the selectors 12, 13 of the individual basic circuits 10 and the selector 22 in the signal processing circuit 81 as described in the above, the input signal INPUT in the signal processing circuit 81 is sequentially shifted through the flipflops FF1 to FF6, and is subjected to EOR operation of the input signal INPUT and the output signals from the flipflops FF2, FF3, FF5, FF6, and a result is output as the output signal OUTPUT1.

Similarly, the input signal INPUT in the signal processing circuit 82 is sequentially shifted through the flipflops FF1 to FF6, and is subjected to EOR operation of the input signal INPUT and the output signals from the flipflops FF1 to FF3 and FF6, and a result is output as the output signal OUTPUT2. It is therefore made possible to realize the circuit operation of the convolutional encoder shown in FIG. 7, by properly controlling the selectors 12, 13 in the individual basic circuits 10 and the selectors 22.

(Linear Feedback Shift Register Circuit)

Figure 11:
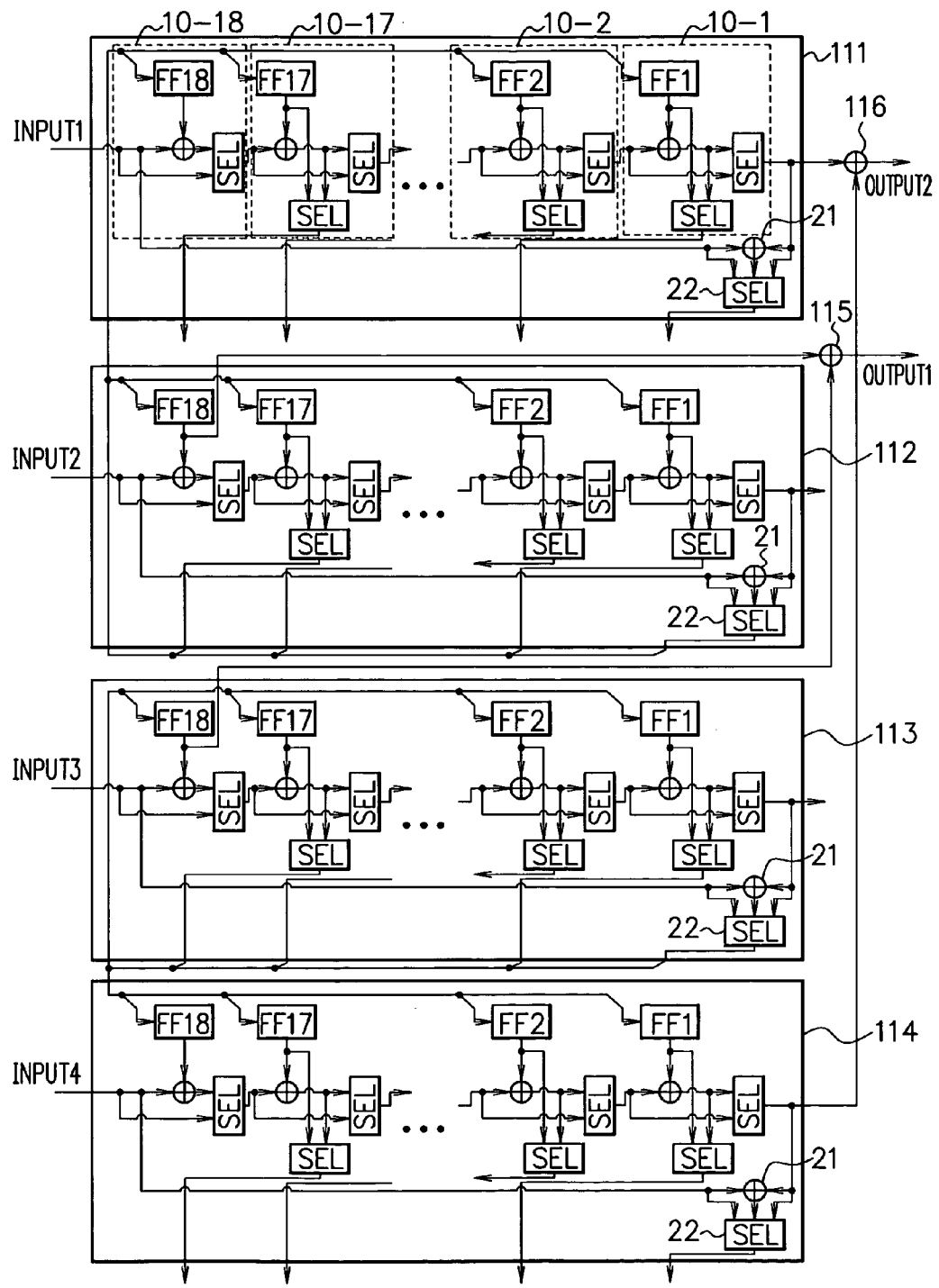
FIG. 11 is a circuit diagram showing a configuration of the linear feedback shift register using the signal processing circuit of the present embodiment.

Next paragraphs will describe a linear feedback shift register circuit using the signal processing circuit of the present embodiment, referring to FIG. 9 to FIG. 11. It is to be noted that the explanation below will deal with an exemplary linear feedback register having a register length of 18.

FIG. 9 is a drawing explaining a principle of configuration of a linear feedback shift register circuit 90 using the signal processing circuit of the present embodiment. In FIG. 9, reference numerals 91, 92, 93, 94 denote signal processing circuits which are similar to the signal processing circuit 20 shown in FIG. 2. That is, the linear feedback shift register circuit 90 is configured by using four signal processing circuits 20 of the present embodiment.

The signal processing circuits 91 to 94 sequentially shift values set in the flipflops FF in the basic circuits 10, and perform predetermined operations using the values. An EOR circuit 95 performs EOR operation of an output signal of the signal processing circuit 91 and an output signal of the signal processing circuit 94, and outputs a result of the operation as the output signal OUTPUT1. Similarly, an EOR circuit 96 performs EOR operation of an output signal of the signal processing circuit 92 and an output signal of the signal processing circuit 93, and outputs a result of the operation as the output signal OUTPUT2.

It is to be noted that, in each of the pair of the signal processing circuits 91, 92, and the pair of the signal processing circuits 93, 94, the flipflops FFi in the basic circuits 10-i composing the signal processing circuit are configured so that each of every correspondent flipflops FFi has the same initial value set therein, and so that an update value is supplied from one signal processing circuit to the other signal processing circuit, so as to keep the value synchronized during the circuit operation.

FIG. 10 is a drawing showing an exemplary configuration of the linear feedback shift register circuit. The linear feedback shift register circuit has a first circuit 101 and a second circuit 102.

The first circuit 101 has a plurality of flipflops FF1 to FF18 connected in series. An EOR circuit 103 performs EOR operation of output signals of the flipflop FF18 and the other flipflop (FF11 in the present embodiment), and inputs a result of the operation to the flipflop FF1 by feedback operation. An EOR circuit 104 performs EOR operation of output signals of the flipflops FF3, FF12, FF14, and outputs a result of the operation.

The second circuit 102 has a plurality of flipflops FF1 to FF18 connected in series. An EOR circuit 105 performs EOR operation of output signals of the flipflop FF18 and other flipflops (FF7, FF11 and FF13 in the present embodiment), and inputs a result of the operation to the flipflop FF1 by feedback operation. An EOR circuit 106 performs EOR operation of output signals of the flipflops FF3 to FF13 (excluding FF11), and outputs a result of the operation.

An EOR circuit 107 performs EOR operation of output signals of the flipflops FF18 provided in the final stages of the first circuit 101 and second circuit 102, and outputs a result of the operation as the output signal OUTPUT1. An EOR circuit 108 performs EOR operation of output signals of the EOR circuit 104 and EOR circuit 106, and outputs a result of the operation as the output signal OUTPUT2.

An exemplary circuit operation of the linear feedback shift register circuit shown in FIG. 10 realized using the signal processing circuit of the present embodiment will be explained referring to FIG. 11.

FIG. 11 is a circuit diagram showing an exemplary configuration of the linear feedback shift register circuit using the signal processing circuit of the present embodiment. In FIG. 11, reference numerals 111, 112, 113, 114 denote signal processing circuits which are similar to the signal processing circuit 20 shown in FIG. 2 assuming m=18, allowing omission of explanation on the configuration.

For the purpose of realizing circuit operation of the linear feedback shift register circuit shown in FIG. 11, it is necessary to set the same initial value to the correspondent flipflops FFi marked with the same value of i in the signal processing circuits 111, 112, and to set the same initial value to the correspondent flipflops FFi marked with the same value of i in the signal processing circuits 113, 114. A value of "0" is entered as the input signals INPUT1 to INPUT4 to the signal processing circuits 111 to 114.

A control is made so that the selectors 12-3, 12-12, 12-14 of the basic circuits 10-3, 10-12, 10-14 in the signal processing circuit 111 select and output outputs of the EOR circuits 11-3, 11-12, 11-14, and the control is also made so that the selectors 12 of the other basic circuits 10 select and control the input signal IN. This allows an operation corresponded to that executed by the EOR circuit 104 in the first circuit 101 shown in FIG. 10 to proceed, and a result of the operation is output as an output signal of the signal processing circuit 111. The selectors 13 of the individual basic circuits 10 and the selector 22 in the signal processing circuit 111 may only arbitrarily be controlled.

A control is also made so that selectors 12-11, 12-18 of basic circuit 10-11, 10-18 in the signal processing circuit 112 select and output outputs of EOR circuits 11-11, 11-18, and so that the selectors 12 of the other basic circuits 10 select and output the input signal IN. The control is still also made so that the selector 22 in the signal processing circuit 112 selects and outputs an output of the EOR circuit 21. This allows an operation corresponded to that executed by the EOR circuit 103 in the first circuit 101 shown in FIG. 10 to proceed, and a result of the operation is output as an update value for the flipflop FF1. The reason why the selector 22 selects and outputs the output of the EOR circuit 21 is to cancel any influences caused by the input signal INPUT2.

A control is made so that the selectors 13 of the individual basic circuits 10 in the signal processing circuit 112 select and output the outputs per se of the internal flipflops FF. This makes it possible to supply each output of the flipflop FFi to flipflop FF(i+1) as an update value, to thereby realize the shift operation. The individual update values for the flipflops FF1 to FF18 output from the selectors 13 and selector 22 in the signal processing circuit 112 are supplied not only to the signal processing circuit 112, but also to the correspondent flipflops FF1 to FF18 of the signal processing circuit 111, in order to synchronize the signal processing circuits 111, 112.

Similarly, a control is made so that the selectors 12 in the basic circuits 10-7, 10-11, 10-13, 10-18 in the signal processing circuit 113 select and control outputs of the correspondent EOR circuits 11, and so that the selectors 12 of the other basic circuits 10 select and output the input signal IN. The control is also made so that the selector 22 in the signal processing circuit 113 selects and outputs an output of the EOR circuit 21. This allows an operation corresponded to that executed by the EOR circuit 105 in the second circuit 102 shown in FIG. 10 to proceed, and a result of the operation is output as an update value of the flipflop FF1.

A control is made so that the selectors 13 of the individual basic circuits 10 in the signal processing circuit 113 select and output the outputs per se of the internal flipflop FF, to thereby realize the shift operation. It is to be noted that the individual update values for the flipflops FF1 to FF18 output from the selectors 13 and selector 22 in the signal processing circuit 113 are supplied not only to the signal processing circuit 113, but also to the correspondent flipflops FF1 to FF18 in the signal processing circuit 114, similarly to the case of the signal processing circuits 111, 112.

A control is also made so that selectors 12 of the basic circuits 10-3 to 10-13 (excluding 10-11) in the signal processing circuit 114 select and output outputs of the correspondent EOR circuits 11, and so that the selectors 12 of the other basic circuits 10 select and output the input signal IN. This allows an operation corresponded to that executed by the EOR circuit 106 in the second circuit 102 shown in FIG. 10 to proceed, and a result of the operation is output as an output signal of the signal processing circuit 114. It is to be noted that the selectors 13 in the individual basic circuits 10 and the selector 22 in the signal processing circuit 114 may only arbitrarily be controlled.

An EOR circuit 115 performs EOR operation of output signals of the flipflops FF18 in the signal processing circuits 112, 113, and outputs a result of the operation as the output signal OUTPUT1. Similarly, an EOR circuit 116 performs EOR operation of output signals of the signal processing circuits 111, 114, and outputs a result of the operation as the output signal OUTPUT2. Circuit operation of the linear feedback shift register circuit shown in FIG. 10 is thus realized.

(n-Bit Batch Processing Circuit)

Figure 13:
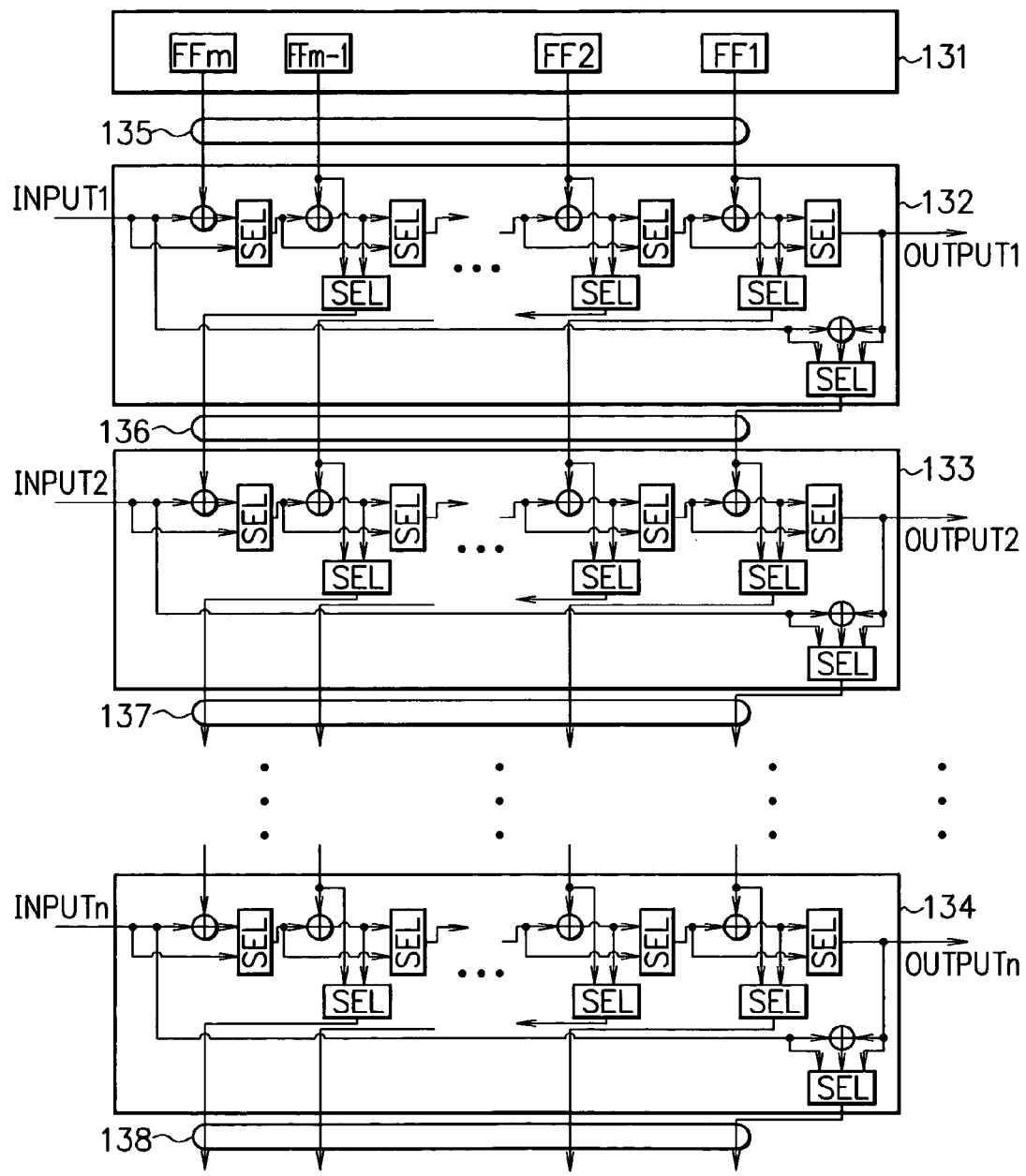
FIG. 13 is a circuit diagram showing an exemplary configuration of the n-bit batch processing circuit applied with the signal processing circuit of the present embodiment.
Figure 14:
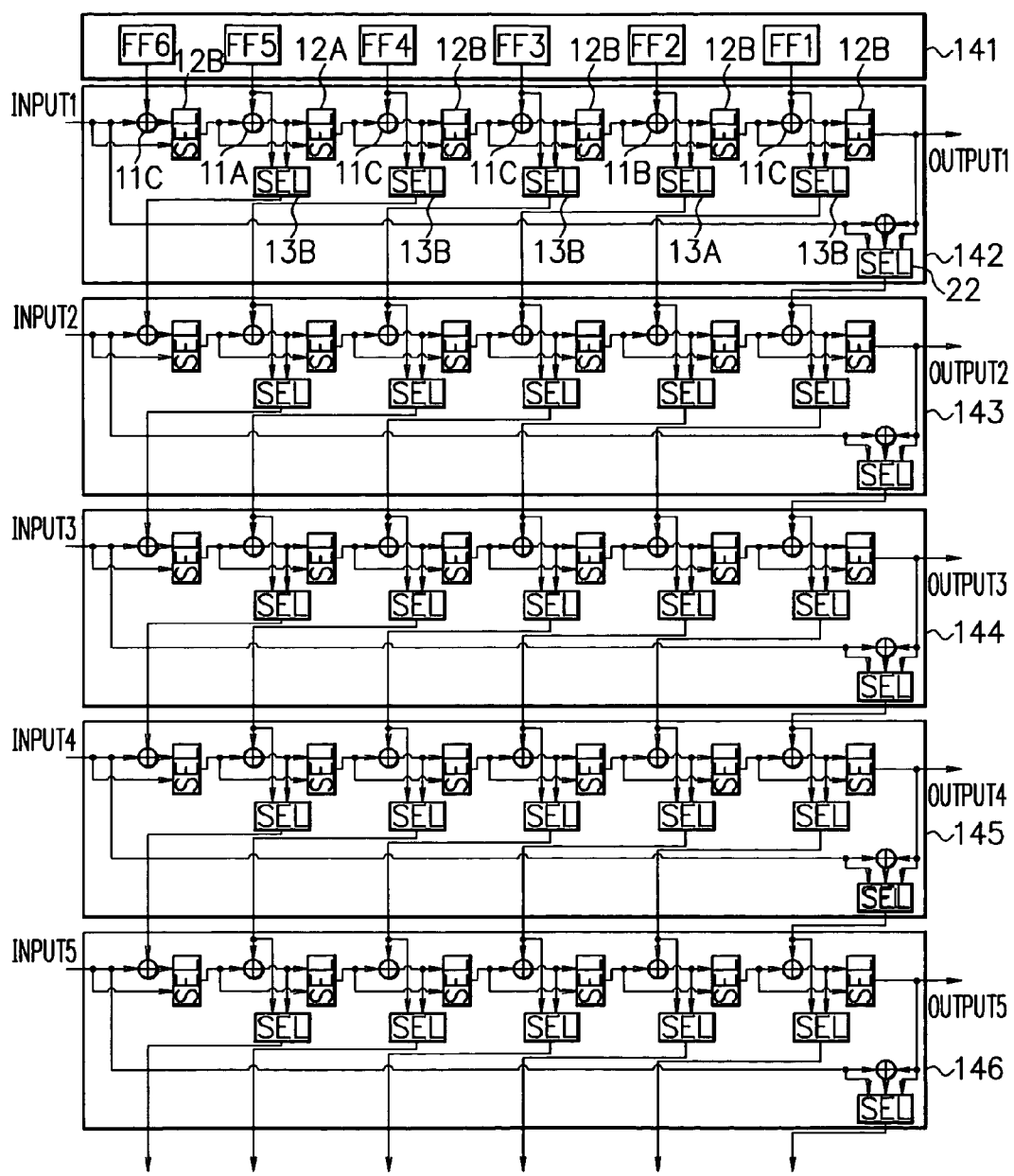
FIG. 14 is a circuit diagram showing an exemplary configuration of a 5-bit batch processing circuit.

The next paragraphs will describe an n-bit batch processing circuit using the signal processing circuit of the present embodiment, referring to FIG. 12 to FIG. 14.

In the signal processing circuit according to the above-described embodiments and a circuit using a plurality of these, processing is proceeded by serially inputting input signals bit by bit, and by inputting update values for the flipflops FF output from the selectors 13 of the basic circuits 10 composing the signal processing circuit into the flipflops FF without modification, to thereby cause bit-by-bit shifting. On the contrary, the n-bit batch processing circuit described below is such as performing a processing by inputting a multiple bits (n bits) at a time, to thereby cause an amount of shifting equivalent to n-time shifting.

FIG. 12 is a drawing explaining a principle of configuration of an n-bit batch processing circuit 120 using the signal processing circuit of the present embodiment In FIG. 12, reference numeral 121 denotes a flipflop (FF) section, and 122 to 124 denote a first to n-th logic circuit sections. The FF section 121 is configured only by the flipflops FF1 to FFm of the basic circuits 10 in the signal processing circuit 20 shown in FIG. 2. Each of the logic circuit sections 122 to 124 comprise EOR circuit 11, selectors 12, 13, EOR circuit 21 and selector 22, excluding the flipflops FF1 to FFm of the basic circuits 10 in the signal processing circuit 20 shown in FIG. 2.

The first logic circuit section 122 receives the external input signal INPUT1 and an output signal of the FF section 121, and outputs the output signal OUTPUT1. The second to n-th logic circuit sections 123, 124 respectively receive the external input signals INPUT2 to INPUTn and output signals of the first to (n−1)-th logic circuit sections (outputs corresponding to update values of the flipflops FF in the signal processing circuit 20), and output the output signals OUTPUT2 to OUTPUTn.

FIG. 13 is a circuit diagram showing an exemplary configuration of the n-bit batch processing circuit applied with the signal processing circuit of the present embodiment. In FIG. 13, reference numeral 131 denotes an FF section, and 132 to 134 denote logic circuit sections. As is obvious from FIG. 13, the configuration of the n-bit batch processing circuit is similar to that of the above-described signal processing circuit 20 except that data is directly supplied from one logic circuit section to another without being mediated by the flipflop FF, so that explanation will be made on operation of the n-bit batch processing circuit, while omitting explanation on the configuration thereof.

Upon input of output values 135 of the individual flipflops FF1 to FFm in the FF section 131 and the input signal INPUT1 to the first logic circuit section 132, the first logic circuit section 132 outputs the output signal OUTPUT1 and output values 136. The output values 136 from the first logic circuit section 132 correspond to the values of the FF section 131 shifted in by one bit.

Next, upon input of output values 136 from the first logic circuit section 132 and the input signal INPUT2 to the second logic circuit section 133, the second logic circuit section 133 outputs the output signal OUTPUT2 and output values 137. The output values 137 from the second logic circuit section 133 correspond to the values of the FF section 131 shifted in by two bits.

Similarly in the succeeding stages, upon input of output values of the (k−1)-th logic circuit section and the input signal INPUTk to the k-th logic circuit section, the k-th logic circuit section outputs the output signal OUTPUTk and output values which correspond to the values of the FF section 131 shifted in by k bits. Repetition of this processing until the n-th logic circuit section 134 is reached makes it possible to output the output signals OUTPUT1 to OUTPUTn at a time from the n-bit batch processing circuit. The update values herein for the flipflops FF1 to FFm are output values 138 from the n-th logic circuit section 134.

By thus configuring the n-bit batch processing circuit using the FF section 131 and first to n-th logic circuit sections 132 to 134 so as to allow simultaneous input of n bits for the processing, the conventional serial processing can now be batch-processed by n bits. As is obvious from the above description, the second to n-th logic circuit sections 132 to 134 can execute circuit operations of scrambler, CRC generator and so forth having an arbitrary number of stages (number of registers), so that simultaneous input of n bits for the processing makes it possible to increase process rate of, for example, scrambler, CRC generator and so forth.

FIG. 14 is a circuit diagram showing an exemplary configuration of a 5-bit batch processing circuit.

In FIG. 14, reference numeral 141 denotes an FF section, and 142 to 145 denote first to fifth logic circuit sections. The FF section 141, and the first to fifth logic circuit sections 142 to 145 are similar to those in the above-described signal processing circuit 20 except that data is directly supplied from one logic circuit section to another without being mediated by the flipflop, allowing omission of explanation on them.

For the purpose of realizing circuit operation of, for example, the CRC generator shown in FIG. 4 using the 5-bit batch processing circuit shown in FIG. 14, it is necessary to control the selector 12A of each of the logic circuit sections 142 to 145 so as to select and output an output of the EOR circuit 11A, and to control the selector 12B so as to select and output the input signal IN (output of the selector 12A or 12B which resides in the preceding stage as viewed from the input side). The control is also made so that the selector 13A selects and outputs an output of the EOR circuit 11B, and so that the selectors 13B select and output the outputs per se of the correspondent flipflops FF1 to FF5 (excluding FF2). The control is also made so that the selectors 22 select and output the output signals OUTPUT1 to OUTPUT5.

By thus inputting 5 bits of the input signal INPUT at a time as the input signals INPUT1 to INPUT5, which have serially been input bit by bit in the CRC generator shown in FIG. 4, the outputs OUTPUT1 to OUTPUT5, which correspond to 5 bits, can be output at a time. This is successful in extremely increasing error detection rate by CRC, for example.

As has been described in the above, the signal processing circuit of the present embodiment is configured using a plurality of basic circuits connected in series, each of the basic circuits being composed of the EOR circuit 11, selectors 12, 13, and flipflop 14. It is also designed so that the selector 12 properly selects and outputs either of an output of the EOR circuit 11 and an input signal of the basic circuit 10, and so that the selector 13 properly selects and outputs either of an output signal of the EOR circuit 11 and an output signal of the flipflop 14. This makes it possible to change signals to be supplied to the other basic circuits 10 connected thereto, to thereby alter the circuit operation depending on selection by the selectors 12, 13, and to realize two or more functions or two or more types of circuit operations on a single signal processing circuit.

It is to be understood that all of the aforementioned embodiments are merely expressions of materialization of the present invention, with which the technical scope of the present invention should not limitedly be interpreted. In other words, the present invention can be embodied in various modified forms without departing from the technical spirit and essential features thereof.

According to the present invention, based on the configuration in which a plurality of basic circuits are connected in series, and each of the basic circuits comprises the first selection circuit which selectively outputs an output signal obtained by signal processing of the first and second input signals or the first input signal, and a second selection circuit which selectively outputs the output signal or the second input signal, and based on the proper selection of the signal output from the first selection circuit and second selection circuit, it is made possible to change operations of the signal processing circuit, and to realize different signal processing on a single circuit depending on the selection. This makes it possible to realize different functions on a single circuit, and also makes it possible for a single circuit having an identical function to configure different types of circuits.

What is claimed is:

1. A signal processing circuit comprising:
   a plurality of basic circuits connected in series, each of said basic circuits including:
   an arithmetic circuit to receive a first input signal and a second input signal, calculate a third signal based on said first input signal and said second input signal, and make the third signal available;
   a first selection circuit to output one of said first input signal and said third signal as a first output signal; and
   a second selection circuit to output one of said second input signal and said third signal as a second output signal,
   wherein said first output signal of said first selection circuit is supplied as an input signal to a second basic circuit of a succeeding stage of said signal processing circuit, as viewed from an input side of said signal processing circuit, and
   said second output signal of said second selection circuit is supplied as an input signal to a third basic circuit of a preceding stage of said signal processing circuit, as viewed from the input side of said signal processing circuit.

2. The signal processing circuit according to claim 1, wherein said arithmetic circuit is a logic circuit.

3. The signal processing circuit according to claim 2, wherein said logic circuit is an exclusive OR circuit.

4. The signal processing circuit according to claim 1, wherein said basic circuit further comprises a holding circuit which holds data, and said second input signal is an output signal of said holding circuit.

5. The signal processing circuit according to claim 4, wherein said basic circuits are connected in series in a direction inverse to the direction of shift operation by said holding circuit.

6. The signal processing circuit according to claim 4, wherein at least two different operations associated with a scrambler are performed by the signal processing circuit based on selections of said first and second selection circuits.

7. The signal processing circuit according to claim 6, wherein at least two different operations relate to a register having a register length that is less than a number of said basic circuits connected in series.

8. The signal processing circuit according to claim 4, wherein at least two different operations associated with a CRC generator are performed by the signal processing circuit based on selections of said first and second selection circuits.

9. The signal processing circuit according to claim 8, wherein the at least two different operations relate to a register having a register length that is less than a number of said basic circuits connected in series.

10. A signal processing circuit comprising two signal processing circuits described in claim 4, to which an identical external input signal is input, and an identical value is set as the initial value for said correspondent holding circuits, so as to enable arbitrary operation of a convolutional encoder.

11. A signal processing circuit comprising two pairs of signal processing circuit groups, each group comprising two signal processing circuits described in claim 4, synchronized in the value of said correspondent holding circuits, so as to enable arbitrary operation of a linear feedback shift register circuit.

12. A signal processing circuit according to claim 11, further comprising:
 a first exclusive OR circuit to which an input signal of a holding circuit on the final stage in the direction of shift operation in one signal processing circuit in each of said signal processing circuit groups is input; and
 a first exclusive OR circuit to which an exclusive OR signal of output signals of arbitrary holding circuits in the other signal processing circuit is input.

13. A signal processing circuit configured as having n (n is a natural number of 2 or more) signal processing circuits described in claim 1 connected in parallel, so as to enable batch processing of n bits.

14. A signal processing circuit comprising:
 a plurality of basic circuits connected in series, each of said basic circuits including:
  an exclusive OR circuit to receive a first input signal and a second input signal, perform an exclusive OR operation upon said first input signal and said second input signal resulting in a third signal, and make the third signal available;
  a first selector to output one of said first input signal and said third signal as a first output signal; and
  a second selector to output one of said second input signal and said third signal as a second output signal,
 wherein said first output signal of said first selector is supplied as an input signal to a second basic circuit of a succeeding stage of said signal processing circuit, as viewed from an input side of said signal processing circuit, and
 said second output signal of said second selector is supplied as an input signal to third basic circuit of a preceding stage of said signal processing circuit, as viewed from the input side of said signal processing circuit.

15. The signal processing circuit according to claim 14, wherein at least one of said basic circuits further includes a flipflop outputting said second input signal.

\* \* \* \* \*